(12) United States Patent
Arvin et al.

(10) Patent No.: US 10,993,324 B2
(45) Date of Patent: Apr. 27, 2021

(54) COMPUTER SYSTEM WITH MODIFIED MODULE SOCKET

(71) Applicant: International Business Machines Corporation, Armonk, NY (US)

(72) Inventors: Charles Leon Arvin, Poughkeepsie, NY (US); Mark K. Hoffmeyer, Rochester, MN (US); Kevin Drummond, Hopewell Junction, NY (US); Chris Muzzy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/451,367

(22) Filed: Jun. 25, 2019

(65) Prior Publication Data

US 2020/0412045 A1 Dec. 31, 2020

(51) Int. Cl.
*H05K 1/14* (2006.01)
*H01R 13/11* (2006.01)
(Continued)

(52) U.S. Cl.
CPC ............ *H05K 1/145* (2013.01); *H01R 12/52* (2013.01); *H01R 12/716* (2013.01); *H01R 13/11* (2013.01);
(Continued)

(58) Field of Classification Search
CPC ........... H05K 1/141–145; H05K 1/181; H05K 2201/049; H05K 1/10189; H05K 1/10325; H01R 12/52; H01R 12/716; H01R 13/11
See application file for complete search history.

(56) References Cited

U.S. PATENT DOCUMENTS 6,969,270 B2 11/2005 Renfro et al.
7,183,646 B2 2/2007 Crane, Jr. et al.
(Continued)

FOREIGN PATENT DOCUMENTS

WO 0227867 A2 4/2002

OTHER PUBLICATIONS

Hejase, et al., "A Hybrid Land Grid Array Socket Connector Design for Achieving Higher Signalling Data Rates," IBM, Systems Group—Power Series Hardware Development, Printed May 6, 2019, 3 pages. https://ieeexplore.ieee.org/stamp/stamp.jsp?arnumber=8329761.

*Primary Examiner* — Hoa C Nguyen
(74) *Attorney, Agent, or Firm* — Peter J. Edwards

(57) ABSTRACT

A modified socket mechanism comprises a printed circuit board and a connector component located on a first face of the printed circuit board. The modified socket mechanism may comprise a first region of electrical contacts located on the first face. The first region of electrical contacts may be designed to interface with a processor module. The modified socket mechanism may also comprise a second region of electrical contacts located on a second face of the printed circuit board. The second region of electrical contacts may be designed to interface with a motherboard. The modified socket mechanism may also comprise a first electrical connection between the connector component and the first region of electrical contacts through the printed circuit board. Finally, the modified socket mechanism may also comprise a second electrical connection between the first region of electrical contacts and the second region of electrical contacts through the printed circuit board.

18 Claims, 2 Drawing Sheets

(51) Int. Cl.
*H01R 12/52* (2011.01)
*H01R 12/71* (2011.01)
*H05K 1/18* (2006.01)

(52) U.S. Cl.
CPC ............ *H05K 1/141* (2013.01); *H05K 1/144* (2013.01); *H05K 1/181* (2013.01); *H05K 2201/049* (2013.01); *H05K 2201/10189* (2013.01); *H05K 2201/10325* (2013.01)

(56) References Cited

U.S. PATENT DOCUMENTS

| | | | |
|---|---|---|---|
| 8,353,708 B2 | 1/2013 | Hsu | |
| 8,708,729 B2 | 4/2014 | An | |
| 9,490,560 B2 | 11/2016 | Chawla et al. | |
| 9,603,276 B2 | 3/2017 | Llapitan et al. | |
| 9,674,954 B2 | 6/2017 | Swaminathan et al. | |
| 9,996,122 B2 | 6/2018 | Norton | |
| 10,197,621 B2 | 2/2019 | Chen et al. | |
| 2014/0198471 A1 | 7/2014 | Kajio et al. | |
| 2014/0349513 A1* | 11/2014 | Mathews | H01R 13/64 439/470 |
| 2015/0079815 A1* | 3/2015 | Leigh | H01R 12/712 439/74 |
| 2016/0261070 A1* | 9/2016 | Hsu | H05K 7/1092 |
| 2018/0226735 A1* | 8/2018 | Leigh | H01R 12/7005 |
| 2018/0366890 A1 | 12/2018 | Lloyd et al. | |
| 2019/0148860 A1* | 5/2019 | Mason | H01R 13/111 439/68 |

\* cited by examiner

COMPUTER SYSTEM WITH MODIFIED MODULE SOCKET

BACKGROUND

The present disclosure relates to data transmission to processor assembly modules, and more specifically, to high-speed communications to processor assembly modules through socket connectors.

Processor assembly modules (sometimes referred to herein as a "processor module" or simply a "module") typically include a printed circuit board, a processor die mounted to that printed circuit board, and a lid surrounding the processor die and mounted to the printed circuit board. This printed circuit board may be referred to as a module printed circuit board, a module board, or others. During installation into a computer system, some processor assembly modules may be inserted into a module socket mechanism (sometimes referred to herein as a "module socket"). This module socket may provide a structural and electrical connection between the module and an additional printed circuit board (e.g., a motherboard printed circuit board, sometimes referred to herein as a "motherboard"). Data sent to the module from other components of the computer system may be received by the motherboard and routed by the motherboard through the module socket and to the module. In some instances, the speed of a data transmission between a component and the module may be determined by the transmission capabilities of the motherboard.

SUMMARY

Some embodiments of the present disclosure can be illustrated as a system comprising a module socket mechanism mounted on a motherboard printed circuit board. The system may also comprise a processor assembly module mounted on the module socket mechanism. The processor assembly module may comprise a processor die mounted on a module printed circuit board. The module printed circuit board may be mounted to the module socket mechanism. The module printed circuit board may transmit electrical signals between the processor die and the motherboard printed circuit board through the module socket mechanism. The system may also comprise a connector component mounted to a surface of the module socket mechanism. Finally, the system may also comprise an electrical connection between the connector component and the processor assembly. The electrical connection may travel through the module socket mechanism while bypassing the motherboard printed circuit board.

Some embodiments of the present disclosure can also be illustrated as a method of assembling a computer system. The method may comprise attaching a connector component to a first face of the module socket mechanism. The first face of the module socket mechanism may be configured to interface with a processor assembly module. The method may also comprise attaching a second face of the module socket mechanism to a motherboard printed circuit board. The method may also comprise attaching a structural support between the second face of the module socket mechanism and the motherboard printed circuit board. Finally, the method may comprise creating an electrical connection between the module printed circuit board and the connector component.

Some embodiments of the present invention can also be illustrated as a modified socket mechanism. The modified socket mechanism may comprise a printed circuit board and a connector component located on a first face of the printed circuit board. The modified socket mechanism may also comprise a first region of electrical contacts located on the first face. The first region of electrical contacts may be designed to interface with a processor module. The modified socket mechanism may also comprise a second region of electrical contacts located on a second face of the printed circuit board. The second region of electrical contacts may be designed to interface with a motherboard. The modified socket mechanism may also comprise a first electrical connection between the connector component and the first region of electrical contacts through the printed circuit board. Finally the modified socket mechanism may also comprise a second electrical connection between the first region of electrical contacts and the second region of electrical contacts through the printed circuit board.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
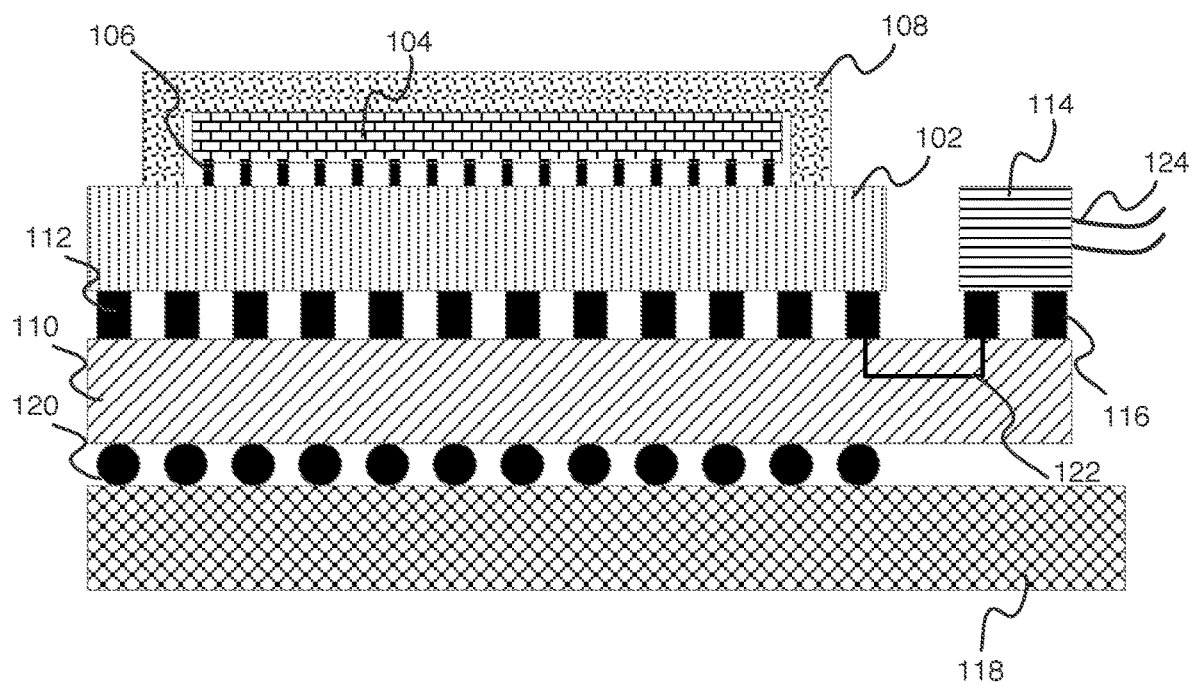
FIG. 1 Illustrates one embodiment of a computer system with a component mounted to a modified module socket, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to data transmission to processor assembly modules, and more specifically, to high-speed communications to processor assembly modules through socket connectors. While the present disclosure is not necessarily limited to such applications, various aspects of the disclosure may be appreciated through a discussion of various examples using this context.

A processor module integrated into computer systems may sometimes be connected to other components of that computer system through a motherboard printed circuit board. The motherboard may be a printed circuit board (sometimes referred to herein as a "PCB") to which the processor module and other components of the computer system are attached. In some instances, a processor module may be attached to the motherboard through a module socket. Module sockets typically pass electrical signals directly from the motherboard to the module (and from the module to the motherboard), rather than rerouting or processing the signals.

In some instances, the ability of a processor module and a component with which the processor module communicates to operate together at their maximum theoretical efficiency may be limited by the speed at which the module and component are able to communicate. For example, signals transmitted by a connector to a module over a network connection (e.g., an Ethernet cable) may be limited to 1 gigabit (Gb) per second. Signals transmitted by a solid state drive over a SATA III connection may be limited to 6 Gb per second (6 Gb/s). While modern motherboards are able to transmit signals very quickly, some motherboards may unable to transmit signals faster than 30 or 40 Gb/s.

Thus, even though some processor modules and connected components are theoretically able to operate together at far faster speeds, they are sometimes limited to the speed of the materials and connection protocols between them, including the speed of the motherboard. For use cases that depend upon a computer component and processor module communicating at speeds faster than the speed of the motherboard (e.g., 50 Gb/s), this may lead to undesirable results.

In some instances, therefore, enabling communications between a module and component to bypass slower connections may be beneficial. For example, where a component and processor module require a transfer speed of 50 Gb/s and compatible motherboards are unable to route communications faster than 30 Gb/s over the required distances, it may be beneficial for the communication path between the component and the processor to bypass the motherboard.

For example, in some designs a connector component may be mounted (structurally and electrically) to the surface of the module PCB. In these designs, the connector component may be configured to accept a signal from a peripheral component (e.g., an add-on card, a second computer processing unit, a graphical processing unit) and route the signal to the module at or over 50 Gb/s. Because the connector component electrically connected to the module PCB, signals from the connector component (e.g., signals that are received by the connector component from a peripheral component and passed to the processor module) may, upon leaving the connector component, pass through the module PCB and to the processor die. Thus, as long as the module PCB is able to send and receive communications at sufficient speeds, the processor die and peripheral component may be capable of operating together at speeds higher than what would be feasible through a motherboard connection.

However, while mounting some components (e.g., connector components) to the surface of a module PCB may increase potential connection speeds, mounting components to the module PCB may also increase strain on the components of the processor assembly, either during assembly formation or while in operation. For example, some connector components may include sockets into which cables from an accelerator card are inserted during operation. Such use cases may require a user to occasionally insert and remove cables from the connector component (e.g., in order to install a new add-on card, to swap out a failing cable). In some instances, the force applied to the connector component while inserting and removing the cables may be trans-lated to the module PCB. If such forces are of ether sufficient magnitude or frequency, these forces may cause undesirable stress on the module PCB. For example, the module PCB could bend over time, causing electrical connections between the module PCB and the processor die to weaken or break completely.

In some processor assembly designs, pressure may be applied through a module lid and into the processor die. This pressure may force the processor die to remain in close proximity to the module PCB, which may be required to maintain sufficient electrical connection between module PCB and the module socket. For example, in some designs a heatsink may be placed upon the module lid and attached to a motherboard and tightened down to the motherboard, pressing onto the module lid. In such assembly designs that also include a connector component mounted on to the module PCB, the pressure may either be translated through the connector component as well as the processor die (for example, by placing the connector component under a portion of the module lid) or the pressure may only be translated through the processor die (for example, by placing the connector component at the peripheral edge of the module PCB and avoiding contact between the module lid and the connector component).

Unfortunately, translating the force necessary to ensure sufficient contact between the processor die and the module PCB through a component on the module PCB surface may lead to undesirable results. For example, the materials that compose some high-speed connector components may deteriorate over time when that amount of force is translated through them. This could cause connector components to fail prematurely. In some use cases, this may lead to down time of vital system processes. In some use cases, this may also result in a need to replace the connector components, which may require undesirable spending. In some use cases, it may not be possible to replace individual failed connector components, and replacing a failed connector component may require replacing an entire module assembly.

Unfortunately, translating the force necessary to ensure sufficient contact between the module PCB and the module socket through only the processor die may also lead to undesirable results. For example, in some use cases a heat sink may push down on a module lid at the center of the module PCB, but not on a connector component mounted at the peripheral edge of the module PCB. This could result in a large discrepancy between the forces applied throughout the module PCB, creating a significant amount of strain throughout the PCB structure. Over time, this strain may cause the module PCB to warp (for example, bow down in the middle and bow up at the peripheral edges). As the module PCB warps, some connections between the module PCB and the processor die may fail. This may require replacement of the module assembly.

In some module assembly designs, the electrical connections between the processor die and the module PCB may be spaced evenly apart. The distance between each pair of electrical connections may be referred to as the pitch, and the pitch for the connections between the processor die and the module PCB may be referred to as the module pitch. In some designs, the module pitch on the module PCB surface to which the module die is mounted may be consistent throughout the surface, such that all components mounted to that surface are required to attach connectors at that module pitch. In some designs, the module pitch may be relatively narrow due to the high number of connections between the module PCB and the processor die. In those designs, mounting a high-speed component (such as a high-speed connector component) to the module PCB may require the electrical contacts of the high-speed component to conform to the module pitch. However, it may be difficult or impossible to connect some high-speed components at the module pitch, because some high-speed components may require contacts that cannot be reduced down to a size that corresponds to some module pitches. In some use cases, requiring a high-speed component to connect at a narrow module pitch may reduce the operating efficiency of the high-speed component, which may frustrate the purpose of mounting the high-speed component on the module PCB.

In some module assembly designs, the dimensions of the module PCB may be only large enough to house the processor die the module lid, and the electrical wiring to the processor die. Minimizing the size of the module PCB within those constraints may reduce costs (e.g., fabrication and material costs) and reduce the time necessary for an electrical signal to travel from one point in the module PCB to another. However, in use cases in which a high-speed component is mounted to a module PCB, the required dimensions of the module PCB may increase significantly. This may be due, in part, to the space on the module PCB surface that is taken up by the high-speed component. This may also be due to the added wiring necessary to electrically connect the high-speed component (for example, to the processor die and ground voltage). In these use cases, the cost of the module PCB may increase, and the speed of communications through that module PCB may decrease.

For at least these reasons, designs that enable a high-speed component to bypass a system motherboard by mounting the high-speed component on the module PCB may be undesirable in some circumstances.

Embodiments of the present disclosure present a module socket mechanism that allows high-speed communications to bypass a system motherboard while avoiding the complications of mounting high-speed components on a module PCB. Some embodiments of the present disclosure incorporate a modified module socket that, in addition to passing signals between the module PCB and the system motherboard, may serve as a mounting point for high-speed components.

In some embodiments, for example, a high-speed connector may be mounted on a modified module socket. For example, in a design in which an external set of graphics processors is required to communicate with a processor module at 60 Gb/s, communicating through a high-speed connector mounted on the system motherboard may reduce the communication speed between the graphics processors and the module by 50%. Further, communicating through a high-speed connector mounted on the module PCB may lead to high cost and complications that reduce the operating life of the module assembly. However, communicating through a high-speed connector mounted on a modified module socket may allow the processor module and set of graphics processors to communicate at 60 Gb/s without creating complications associated with the module PCB.

In some embodiments, the modified module socket may take the form of a printed circuit board with electrical wiring layers present therein. In some embodiments, the modified module socket may include electrical mounting points for a high-speed component that allow the high-speed component to be structurally and electrically connected to the module socket. The module socket may also include electrical paths that pass electrical signals between the high-speed component and a module PCB that is mounted in the module socket. In some embodiments, the module socket, system motherboard, or both may include structural components, such as a stiffener, that help to absorb forces associated with the use of the high-speed component (e.g., plugging and unplugging). In some embodiments, the module socket may include structural components, such as a retention bracket, that assist with the mounting and retention of the high-speed components on the module socket.

FIG. 1 Illustrates one embodiment of a computer system with a component mounted to a modified module socket, in accordance with the present disclosure. As illustrated, module PCB 102 connects to processor die 104 through die connections 106. Processor die 104 is surrounded by module lid 108, which may enclose processor die 104 on all four sides and on the top. In some embodiments, module lid 104 may be structurally attached to module PCB 102 (for example, through a soldered connection). While no heat sink is illustrated in FIG. 1, in some embodiments a heat sink may apply a force onto module lid 108 that is translated through module lid 108 onto processor die 104. This force may assist in maintaining a strong connection between processor die 104, die connections 106, and module PCB 102.

Module PCB 102 connects to socket 110 through socket connections 112. Socket 110 may be a modified module socket with wiring layers present therein. In some embodiments, socket 110 may also contain through holes as illustrated, the pitch of socket connections 112 is wider than the pitch of die connections 106. In some embodiments, however, the pitches of socket connections 112 may not be wider than the pitch of die connections 106.

As illustrated, component 114 is mounted onto socket 110 through component connections 116. Component 114 may be a high-speed component, such as a high-speed connector. The pitch of component connections 116, as illustrated, is equal to the pitch of socket connections 112. However, in some embodiments, the pitch of component connections 116 may not be equal to the pitch of socket connections 112.

Socket 110 is mounted to motherboard 118. Motherboard connections 120 are situated between socket 110 and motherboard 118. In some embodiments, motherboard connections 120 may contribute to the structural connection between socket 110 and motherboard 118. In other embodiments, socket 110 may be attached to motherboard 118 at another point, and motherboard connections 120 may serve as electrical connections between module PCB and motherboard 118. In some embodiments, these electrical connections may take the form of a pass-through connection, meaning that no routing takes place. For example, one of module connections may pass an electrical signal through socket 110 to a corresponding motherboard connection 120. In some embodiments, passing this signal through socket 110 may utilize a conductive via, or through hole, that physically spans from the top of socket 110 to the bottom of socket 110. In some embodiments, passing this signal through socket 110 may utilize a compliant spring or pin that spans socket 110 and physically contacts socket connections 112 and motherboard connections 120. In some embodiments, motherboard connections 120 and socket connections 112 may be two ends of a single electrical connector, such as a compliant pin.

The system of FIG. 1 includes connection indicator 122 for the purposes of understanding; connection indicator 122 serves to represent an electrical connection between component 114 and module PCB 102 that is carried on or through socket 110. This illustrates that socket 110 is a modified socket. In other words, socket 110 does not only pass electrical signal directly from a socket connection 112 to a corresponding motherboard connection 120 (e.g., through a conductive via), but socket 110 also includes some electrical wiring that allows a signal to travel from a component connection 114 to a socket connection 112. The signal may then pass through module PCB 102 and die connections 106 to processor die 104. In some embodiments, connection indicator 122 may represent a wire, trace, spring, solder ball, pin, pad, or other electrical connection. The precise nature and routing of the electrical connection between component 114 and module PCB 102 is beyond the scope of this disclosure.

Component 114, as illustrated, communicates to off-board components through wires 124. These wires may be, for example, copper or optical wires, and may connect component 114 to a high-speed add-on component, such as an accelerator card, an additional processor or set of processors, one or more external graphics processors, or others. This high-speed add-on component may send and receive signals from processor die 104 though wires 124, component 114, component connections 116, socket 110 (e.g., through a wire represented by connection indicator 122), socket connection 112, module PCB 102, and die connection 106.

Die connections 106, socket connections 112, component connections 116, and motherboard connections 120 may be several different types of connections, depending upon the use case. As illustrated, for example, die connections 106, socket connections 112, and component connections 116 are of an unspecified form, whereas motherboard connections 118 are illustrated as solder balls. However, in some embodiments die connections 106, socket connections 112, component connections 116, and motherboard connections 120 may be any of solder balls, pins, springs, pads, or other connections.

As illustrated, motherboard connections 120 do not extend over the width of socket 110. In some embodiments, this may be beneficial to reduce the material costs associated with providing motherboard connections across the width of socket 110. In some embodiments this may be possible because component 114 may not have any connection to the motherboard, in which case no electrical connections below component 114 and between socket 110 and motherboard 118 may be necessary. In some embodiments, however, it may be beneficial for motherboard connections 120 to be placed under component 114 as well. This may be beneficial to reduce stress forces on socket 110 associated with the use of component 114, and may also be beneficial in embodiments in which some connection between component 114 and motherboard 118 (e.g., power and ground connections) may be useful. Thus, in some embodiments of the system illustrated by FIG. 1, solder balls in a ball grid array may be located under component 114 and between socket 110 and motherboard 118.

However, in some embodiments a modified socket may benefit from structural support that is more significant than may typically be provided by typical motherboard electrical connections. This may be, for example, because a modified module socket is composed of printed circuit board materials and contains more internal wiring than a typical module socket. In some use case, the materials of a PCB may be less structurally resistant to deforming when outside forces are applied to the PCB because of the materials necessary to allow for electrical connections throughout the PCB. Further, a printed-circuit-board modified module socket may be more vulnerable than a standard module socket to deformations because the electrical connections in the printed circuit board may lose connection when the shape of the modified module socket changes (e.g., bends) due to applied forces. Therefore, increasing the amount of structural support under a component that is mounted on a modified module socket may be beneficial. For example, in some embodiments supporting a socket using a stiffener or metal spacer may provide more support than electrical connectors. In some embodiments supporting a socket using multiple materials of different flexibility may be beneficial.

Figure 2:
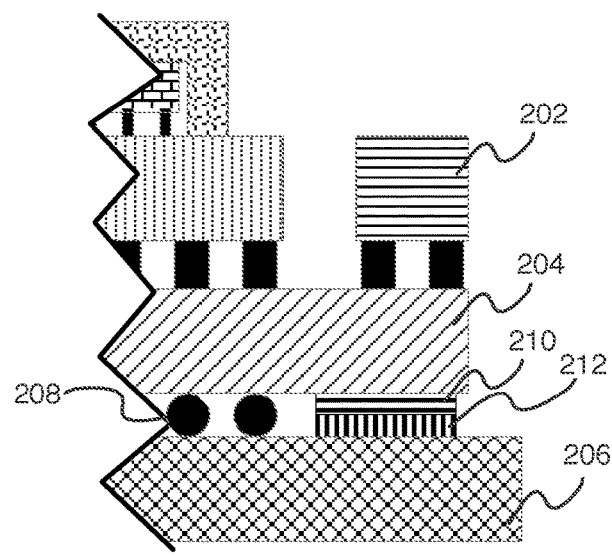
FIG. 2 illustrates a partial view of a system in which a modified socket is supported using a spacer of multiple materials, in accordance with embodiments of the present disclosure.

FIG. 2 illustrates a partial view of a system in which a modified socket is supported using a spacer of multiple materials. In FIG. 2, component 202 is mounted to modified socket 204. At some portions of socket 204, socket 204 is connected to motherboard 206 through motherboard connections 208. As illustrated, motherboard connections 208 do not extend to the portion of socket 204 onto which component 202 is mounted. Rather, a 2-portion structural support is placed below component 202 such that an axis that is perpendicular to the surface of the socket 204 passes through the 2-portion structural support and component 202.

Top support portion 210 may be composed of a relatively flexible material. For example, top support portion 210 may be designed to provide some cushion to socket 204. In some embodiments, providing cushioning support may prevent a connection that is brittle. Bottom support portion 212, on the other hand, may be a relatively inflexible material. For example, bottom support portion 212 may be designed to prevent modified socket 204 from flexing (i.e., bending) to an extent so significant that modified socket 204 becomes damaged (e.g., to crack, break) or to an extent so significant that the connections between modified spacer 204 and other components of the system (e.g., motherboard 206) are negatively impacted. In some embodiments, the support mechanism illustrated in FIG. 2 may reduce the ability of modified socket to flex toward motherboard 206 or away from motherboard 206.

In some use cases, forces exerted on a modified socket may, in addition to causing the modified socket to flex toward or away from a motherboard. In these use cases, for example, the forces resulting from plugging and unplugging one or more high-speed connectors may, over time, tend to cause the modified socket to twist. This may damage the modified socket (e.g., cause structural damage to the modified socket, fracture electrical connections running through the modified socket, or others).

Figure 3A:
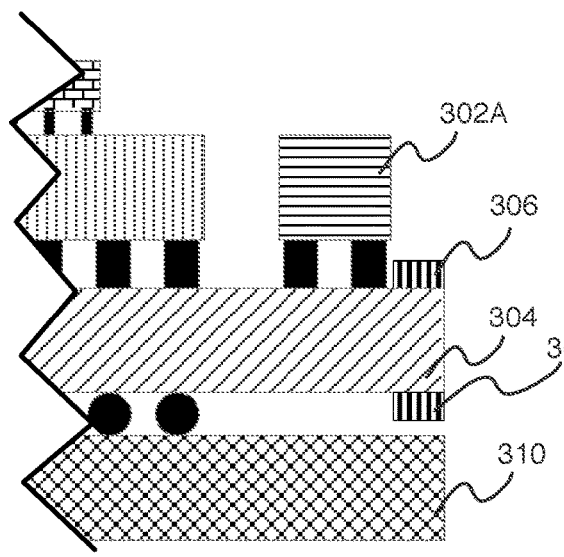
FIG. 3A illustrates a partial view of a system in which a modified socket is supported using two lateral stiffeners, in accordance with embodiments of the present disclosure.

FIG. 3A illustrates a partial view of a system in which a modified socket is supported using two lateral stiffeners. In FIG. 3A, component 302A is mounted to socket 304. Socket 304 may include stiffeners 306 and 308. As illustrated, stiffeners 306 and 308 are located at the edge of the top socket surface and bottom socket surface respectively, and stiffener 306 is located between component 302A and the edge of the top socket surface. However, other stiffener placements consistent with the other embodiments of this disclosure are possible. In some embodiments, stiffeners 306 and 308 may span the length of socket 304 (e.g., stiffeners 306 and 308 may, in theory, extend into and out of a sheet of paper onto which FIG. 3A is printed).

Stiffeners 306 and 308 may serve to prevent undue twisting of modified socket 304, which may prevent damage to modified socket 304. However, as illustrated, stiffener 308 does not extend to or bond with motherboard 310. Therefore, in some embodiments, including a spacer (such as the spacer composed of top support portion 210 and bottom support portion of 212 of FIG. 2) between socket 304 and motherboard 310 may be beneficial. In these embodiments, stiffener 308 may extend from a surface of socket 304 and contact motherboard 310. In other embodiments, bottom support portion 308 may be of the illustrated design, and an added spacer may be mounted on the "bottom" surface of PCB 304 and span to the "top" of motherboard 310, In this way, stiffener 308 may simultaneously mitigate a tendency of socket 304 to twist or flex during proper or improper uses of component 302A.

Figure 3B:
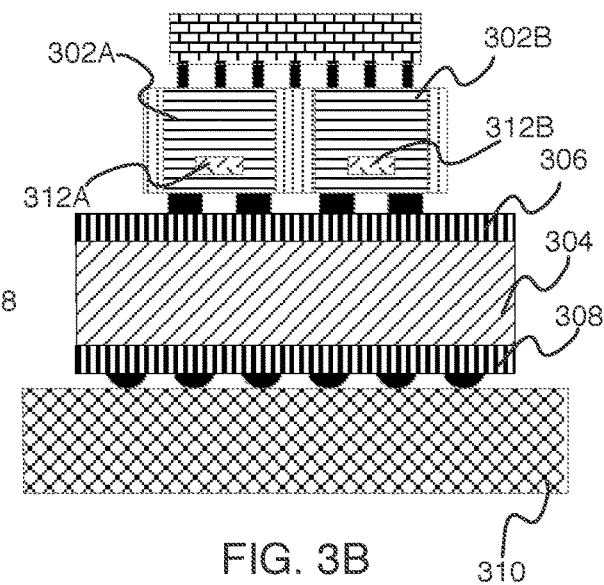
FIG. 3B illustrates an alternative view of the system illustrated in FIG. 3A for the purposes of understanding.

FIG. 3B illustrates an alternative view of the system illustrated in FIG. 3A for the purposes of understanding. The view presented in FIG. 3B represents what a viewer would see if viewing the system of FIG. 3A from the right side of the system.

As illustrated in FIG. 3B, two components 302A and 302B are mounted on modified socket 304. From this view, ports 312A and 312B is visible on each component 302A and 302B. Thus, as illustrated, components 302A and 302B may be high-speed connectors, and a user may plug a cable into ports 312A and 312B to allow components 302A and 302B to communicate with a high-speed component such as a nearby server. However, as cables are plugged into and removed from ports 312A and 312B by users, the users may exert more force on the system than it is designed to absorb.

For example, if a user is plugging something into port 312A, the user may brace himself or herself on component 302A, causing the weight of the user's hand to exert a force through component 312A and into the left side (as illustrated) of modified socket 304. In some embodiments, this force may cause damage to the system without some structural support to mitigate the force (as illustrated, stiffeners 306 and 308). This is because, in this example, the force is only applied to the left side of modified socket 304, the force may tend to cause modified socket 304 to bend down at the left side with respect to the right side. This bending may cause bending stress throughout modified socket, which may weaken the material of modified socket over time. If modified socket were composed of a PCB material, the electrical connections running through modified socket 304 may be negatively affected.

However, in the embodiments illustrated by FIGS. 3A and 3B, stiffeners 306 and 308 are attached to modified socket 304 in a way that would tend to prevent modified socket 304 from bending. Applying the previous example, the force exerted by the user on component 302A may be translated to the left side of modified socket 304. However, that force would then be translated to and distributed through stiffeners 306 and 308 before bending modified socket 304. Thus, in the previous example, if stiffeners 306 and 308 were composed of resilient materials that are resistant to bending, they may be capable of absorbing the user's force and prevent any bending in modified socket 304.

In some use cases, utilizing retention hardware (e.g., a retention bracket or clamp) over a module package may be beneficial. For example, in some embodiments a retention clamp may be used to apply pressure to the top of a module lid to maintain electrical contact between the processor die and module PCB. In some embodiments, it may also be beneficial for a retention clamp to contact stiffener components near components mounted on a modified socket in order to provide structural support for the surrounding area.

Figure 4A:
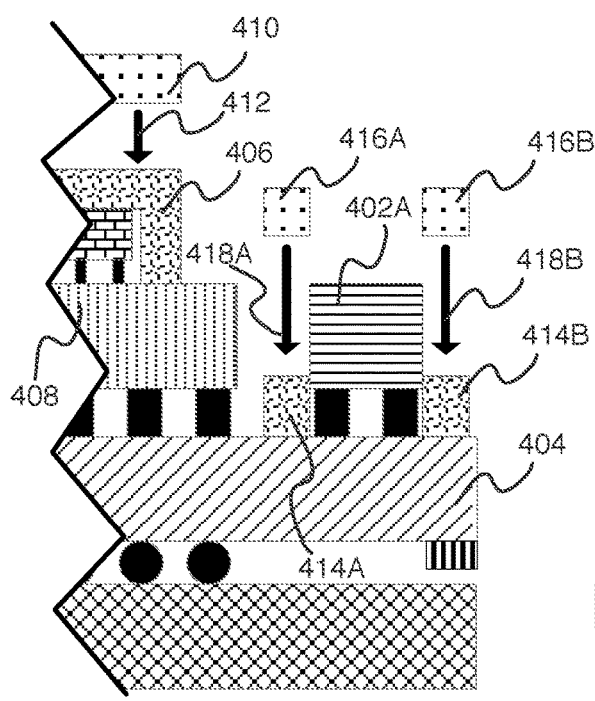
FIG. 4A illustrates a partial view of a system in which a modified socket is supported by retention hardware, in accordance with embodiments of the present disclosure.

FIG. 4A illustrates a partial view of a system in which a modified socket is supported by retention hardware. As illustrated, the system contains one or more components 402 mounted to a modified socket 404. Module lid 406 is mounted to module PCB 408, as illustrated, is mounted onto a module PCB. As illustrated, module lid 406 is designed to interface with retention hardware 410 (i.e., at least a portion of a face of module lid 406 touches at least a portion of a face of retention hardware 410). Retention hardware 410 may, for example, take the form of a clamp that closes onto the module assembly during installation of the module. As illustrated, the closing motion of retention hardware 410 is disclosed by movement arrow 412. When closed, retention hardware 410 may be pressed against module lid 406. Retention hardware 410 may function to translate force through module lid 406 to maintain electrical connectivity throughout the module assembly, and may also function to prevent the components of the module assembly from shifting position. In some use cases, retention hardware 410 may include a heat sink.

Components 402 may be bordered on either side by retention braces 414. As illustrated, retention brackets 414A and 414B interface with component 402A, which may help prevent component 402A from shifting or tilting left or right (from the perspective illustrated in FIG. 4A). However, in other embodiments, some space may exist between component 402A and retention braces 414A and 414B. Like module lid 410, retention braces 414A and 414B may be designed to interface with retention hardware 416A and 416B. As illustrated, this would also result in component 402A interfacing with retention hardware 416A and 416B in a similar way that component 402A interfaces with retention braces 414A and 414B.

For example, retention hardware 416A and 416B may close onto retention braces 414 with a clamp during assembly of the system. As illustrated, the closing motion of retention hardware 416A and 416B is shown by movement arrows 418A and 418B. In some embodiments, the clamp that operates retention hardware 416A and 416B may be the same clamp that operates retention hardware 410. In other embodiments, however, it may be beneficial for retention hardware 416A and 416B to be operated by a separate clamp. This may be beneficial in embodiments in which the force placed upon module lid 406 by retention hardware 410 may be necessary to keep sufficient electrical contact throughout the module assembly, but would result in potential damage if placed upon modified socket through retention braces 414.

In some embodiments, retention hardware 410 and 416A and 416B may be secured to a stable portion of the system (e.g., a system chassis, an anchor bracket). In some embodiments this may increase the structural stability of retention hardware 410 and 416A and 416B and may increase the ability of retention hardware 410 and 416A and 416B to provide structural resiliency to the rest of the system. In some embodiments, this may be used to prevent system components from shifting by anchoring the system components in place. In other embodiments, this may protect system components from applied forces by allowing retention hardware 410 and 416A and 416B to absorb higher force than they would be able to if they were not secured to a stable component of the system.

Figure 4B:
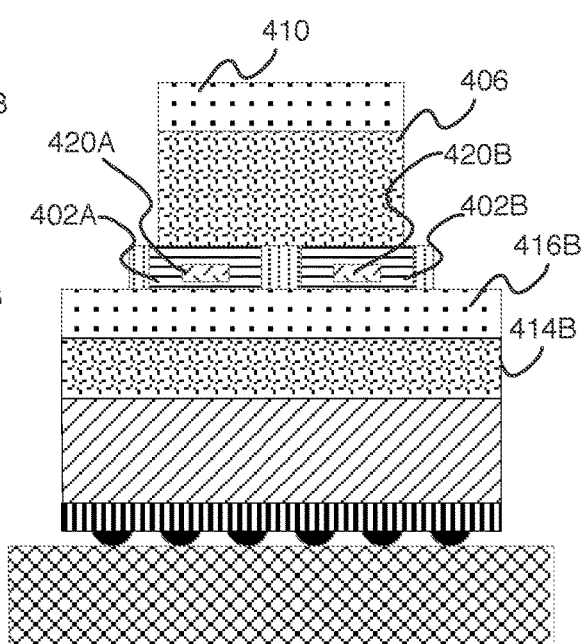
FIG. 4B illustrates an alternative view of the system illustrated in FIG. 4A for the purposes of understanding.

FIG. 4B illustrates an alternative view of the system illustrated in FIG. 4A for the purposes of understanding. The view presented in FIG. 4B represents what a viewer would see if viewing the system of FIG. 4A from the right side of the system.

In FIG. 4B, retention hardware 410 and 416B are shown clamped down onto module lid 406 and retention brace 414B respectively. In their clamped-down position, retention hardware 416B is located below ports 420A and 420B of components 402A and 402B. This may provide structural resiliency to the system while still enabling ports 420A and 420B to be used.

With retention hardware 416B clamped down, the structural resiliency of retention hardware 416B (particularly when retention hardware 416B is anchored to a stable portion of the system) may be transferred to retention braces 414B, which may therefore be translated to modified socket 404.

For example, a user of the system may attempt to unplug a stuck cable from port 420A. In doing so, the user may inadvertently pull on component 402A or 402B, or may press on retention hardware 416B. Because retention hardware 416B is providing resiliency to the system, retention hardware 416B may be able to absorb the forces that the user is inadvertently introducing to the system, particularly if retention hardware 416B is anchored to a stable portion of the system. This may keep system components in place and prevent bending or shifting of components, preventing potential component damage.

In some embodiments of the present disclosure, a single component (e.g., a high-speed connector) may be illustrated as mounted on a modified module socket. However, in some embodiments of the present disclosure, multiple components may be mounted to a modified socket. This may be beneficial, for example, in use cases in which a processor die is required to communicate with more than one high-speed add-on card. In some embodiments, for example, communicating with high-speed add-on cards may require so much bandwidth that each add-on card may require a separate high-speed connector mounted on the modified socket.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system comprising:
a module socket mechanism mounted on a motherboard printed circuit board;
a processor assembly module mounted on the module socket mechanism, the processor assembly module comprising:
a processor die mounted on a module printed circuit board;
the module printed circuit board mounted to the module socket mechanism, wherein the module printed circuit board transmits electrical signals between the processor die and the motherboard printed circuit board through the module socket mechanism;
a connector component mounted to a surface of the module socket mechanism;
a spacer located near the connector component and between the module socket mechanism and the motherboard printed circuit board; and
an electrical connection between the connector component and the processor assembly, the electrical connection traveling through the module socket mechanism and bypassing the motherboard printed circuit board.

2. The System of claim 1, wherein the spacer is a two-portion structure support spacer.

3. The system of claim 1, further comprising a first stiffener located on the socket mechanism between the connector component and an edge of the socket mechanism; and a second stiffener located between the socket mechanism and the motherboard printed circuit board.

4. The system of claim 1, further comprising:
a retention bracket mounted to the module socket mechanism; and
moveable retention hardware that is moveable between an open and closed position;
wherein the retention bracket is designed to interface with moveable retention hardware when the moveable retention hardware is in the closed position.

5. The system of claim 4, wherein the moveable retention hardware is structurally secured to a stable portion of the system.

6. The system of claim 4, wherein the moveable retention hardware interfaces with the connector component when in the closed position.

7. A method of assembling a computer system, the method comprising:
attaching a connector component to a first face of a module socket mechanism, wherein the first face of the module socket mechanism is configured to interface with a processor assembly module;
attaching a second face of the module socket mechanism to a motherboard printed circuit board;
attaching a structural support between the second face of the module socket mechanism and the motherboard printed circuit board, wherein the structural support does not supply an electrical connection and wherein is located near an axis that is perpendicular to the surface of the motherboard printed circuit board and passes through the connector component; and
creating an electrical connection between a module printed circuit board of the module socket mechanism and the connector component.

8. The method of claim 7, further comprising attaching a stiffener to the socket mechanism.

9. The method of claim 8, wherein the stiffener is located at the edge of the second face of the module socket mechanism between the connector component and the edge of the module socket mechanism.

10. The method of claim 7, further comprising adding a second stiffener to the socket mechanism between the motherboard printed circuit board and the second face of the module socket mechanism.

11. The method of claim 7, wherein the structural support takes the form of a ball grid array.

12. The method of claim 7, wherein the structural support takes the form of a two-portion structural support spacer.

13. The method of 7, wherein attaching the structural support comprises mounting the structural support between the module socket mechanism and the motherboard printed circuit board, such that an axis that is perpendicular to the first face of the module socket mechanism and that passes through the center of the connector component also passes through the of the structural support.

14. A modified socket mechanism, comprising:
a printed circuit board;
a connector component located on a first face of the printed circuit board;
a first region of electrical contacts located on the first face, wherein the first region of electrical contacts are designed to interface with a processor module;
a second region of electrical contacts located on a second face of the printed circuit board, wherein the second region of electrical contacts are designed to interface with a motherboard;
a first electrical connection between the connector component and the first region of electrical contacts through the printed circuit board;

a second electrical connection between the first region of electrical contacts and the second region of electrical contacts through the printed circuit board;

a retention brace located on the first face of the modified socket mechanism between the connector component and an edge of the printed circuit board, wherein the retention brace is configured to interface with a retention clamp.

15. The modified socket mechanism of claim 14, further comprising:

a first stiffener located on the first face of the printed circuit board; and a second stiffener located on the second face of the printed circuit board.

16. The modified socket mechanism of claim 15, wherein the first stiffener and second stiffener span the length of the modified socket mechanism.

17. The modified socket mechanism of claim 14, further comprising a spacer located on the second face of the printed circuit board such that an axis that is perpendicular to the first face of the module socket mechanism and that passes through the center of the connector component also passes through the center of the spacer.

18. The modified socket mechanism of claim 17, wherein the spacer is a 2-portion structural support.

* * * * *